(12) United States Patent
Yu et al.

(10) Patent No.: US 7,696,075 B2
(45) Date of Patent: Apr. 13, 2010

(54) METHOD OF FABRICATING SEMICONDUCTOR DEVICE HAVING A RECESS CHANNEL STRUCTURE THEREIN

(75) Inventors: Chien-An Yu, Taipei County (TW); Te-Yin Chen, Taoyuan County (TW); Hai-Han Hung, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 72 days.

(21) Appl. No.: 12/055,298

(22) Filed: Mar. 25, 2008

(65) Prior Publication Data

US 2009/0148993 A1 Jun. 11, 2009

(30) Foreign Application Priority Data

Dec. 10, 2007 (TW) .............................. 96147024 A

(51) Int. Cl.
*H01L 21/3205* (2006.01)
*H01L 21/4763* (2006.01)
(52) U.S. Cl. ............... 438/589; 438/163; 257/E21.621; 257/E21.624; 257/E21.618
(58) Field of Classification Search ................. 438/589, 438/163; 257/E21.621, E21.624, E21.629, 257/E21.633, E21.618
See application file for complete search history.

(56) References Cited

U.S. PATENT DOCUMENTS

| 2007/0249123 | A1* | 10/2007 | Chou et al. | ................. 438/270 |
| 2008/0012067 | A1* | 1/2008 | Wu | ............................. 257/330 |
| 2008/0023742 | A1* | 1/2008 | Lee | ............................. 257/296 |
| 2008/0035962 | A1* | 2/2008 | Kim et al. | .................... 257/288 |

* cited by examiner

*Primary Examiner*—Caridad M Everhart
(74) *Attorney, Agent, or Firm*—Jianq Chyun IP Office

(57) ABSTRACT

A method of fabricating a semiconductor device having a recess channel structure is provided. A first recess is formed in a substrate. A liner and a filling layer are formed in the first recess. A portion of the substrate adjacent to the first recess and a portion of the liner and the filling layer are removed to form trenches. An insulation layer fills the trenches to form isolation structures. The filling layer is removed, using the liner as an etching stop layer, to expose the insulation layer. A portion of the exposed insulation layer is removed to form a second recess having divots adjacent to the sidewalls of the substrate. The liner is removed. A dielectric layer and a gate are formed over the substrate covering the second recess. Source and drain regions are formed in the substrate adjacent to the second recess.

5 Claims, 17 Drawing Sheets

METHOD OF FABRICATING SEMICONDUCTOR DEVICE HAVING A RECESS CHANNEL STRUCTURE THEREIN

CROSS-REFERENCE TO RELATED APPLICATION

This application claims the priority benefit of Taiwan application serial no. 96147024, filed on Dec. 10, 2007. The entirety the above-mentioned patent application is hereby incorporated by reference herein and made a part of specification.

BACKGROUND OF THE INVENTION

1. Field of Invention

The present invention relates to a method of fabricating a semiconductor device, and more particularly to a method of fabricating a semiconductor device having a recess channel structure therein.

2. Description of Related Art

As a dimension of a MOSFET (metal-oxide-semiconductor field effect transistor) device is getting smaller, a channel length of a semiconductor device becomes shorter as well. Such a short channel length may somehow increase the OFF leakage current of the device. An increase dosage of ion implantation can solve the above-mentioned problem, but this will also increase the leakage current in a storage node junction, and thus shorten data retention time.

One of the known methods for increasing the channel length effectively is to apply a recess channel structure to a MOSFET device.

FIGS. 1A to 1E are schematic cross-sectional views illustrating a process flow of fabricating a conventional MOS (metal-oxide-semiconductor) device having a recess channel structure.

Referring to FIG. 1A, the method of fabricating a MOS device having a recess channel structure includes forming shallow trench isolation structures in a substrate 100, and then forming a recess having a recess channel structure by an etching process. A patterned pad oxide layer 102 and a patterned pad silicon nitride layer 104 are initially formed on the substrate 100. An etching process is performed for forming trenches 106 in the substrate 100 by using the patterned pad silicon nitride layer 104 as an etching mask. An insulation material fills the trenches 106 to form shallow trench isolation structures 108. After the shallow trench isolation structures 108 are formed, a patterned hard mask layer 110 and a patterned photoresist layer 112 are formed on the substrate. The patterned hard mask layer 110 and the patterned photoresist layer 112 have an opening 114. The opening 114 exposes a portion of the patterned pad silicon nitride layer 104 and the adjacent insulation layer of the shallow trench isolation structures 108.

Referring to FIG. 1B, a first etching process is performed, using the patterned photoresist layer 112 as an etching mask, to remove the exposed patterned silicon nitride layer 104 and the adjacent insulation layer of the shallow trench isolation structures 108 so as to form a recess 116. The bottom of the recess 116 is supposed to be at a position depicted by the dotted line 118, which is predetermined to be a recess channel. However, after the first etching process, the recess 116 formed can not reach the original position shown by the dotted line 118 (i.e. the predetermined recess channel). Silicon horns 100a remain above the dotted line in the substrate 100.

Referring to FIG. 1C, a CDE (corner device extent) process is performed to remove the silicon horns 100a because the silicon horns 100a tend to lower the breakdown voltage and cause the leakage current problems. A CDF (corner device formation) process is then performed to remove the insulation layer of the shallow trench isolation structures 108 on sidewalls of the recess 116 so as to form a recess 122 with divots 120. Hence, the recess channel region 118 is exposed, as shown in FIG. 1D. The formation of the divots 120 can improve the performance of the device.

Referring to FIG. 1E, the patterned photoresist layer 112 and the patterned hard mask layer 110 are removed. A gate dielectric layer 124 is formed on the recess channel region 118 of the recess 122. A conductive layer fills into the recess 122 and a patterning process is performed thereon so as to form a gate 126. Thereafter, an ion implant process is performed to form source and drain regions. The source and drain regions are not shown in FIG. 1E because they can only be shown in a different direction.

In the above-mentioned method, the recess 116 extends outwardly to become the recess 122 when the CDF process is performed to form the divots 120. If the recess 122 is excessively extended, the gate 126 may connect with the adjacent contact plugs, such as the contact plugs of the word lines. Ultimately, a short current problem occurred.

To avoid the problem of excessively extending outwardly caused by the lateral over-etching during the CDF process, the insulation layer is usually formed as a sandwich structure including a liner when a conventional shallow trench isolation structure is fabricated. Referring to FIG. 1A, a first silicon oxide layer 108a is formed in the trenches 106. Thereafter, a silicon nitride liner 108b and then a second oxide layer 108c are formed. In the CDF process, the etching proceeds only through the first silicon oxide layer 108a and stops on the silicon nitride liner 108b. Thus, the lateral over-etching problem can be avoided. However, this method requires a plurality of layers of materials, so the process becomes very complicated. Moreover, the thickness of the first silicon oxide layer 108a is so thin that the first silicon oxide layer 108a has high aspect ratio and the depth of the divots 120 is not deep enough after the CDF process. If a deeper depth of the divots 120 is necessarily required, the recess 122 formed may excessively extend outwardly, as shown in FIG. 1D.

Also, if a misalignment occurs during the patterning process of the photoresist layer 112, the position of the patterned photoresist layer 112 may shift. Hence, the depths and sizes of the divots 120 may be different beside the recess channel region 118, and deviations among devices are resulted.

SUMMARY OF THE INVENTION

The present invention provides a method of fabricating a semiconductor device having a recess channel structure to prevent the recess from being excessively extended outwardly.

The present invention provides a method of fabricating a semiconductor device having a recess channel structure. According to the method of the invention, the divots formed adjacent to the recess channel region have similar sizes and depths.

The present invention provides a method of fabricating a semiconductor device having a recess channel structure. A recess is formed in a substrate. A filling layer is then formed to fill the recess. Thereafter, an active area is formed on the substrate. The filling layer is removed to expose the substrate and a recess channel region is defined. Afterwards, a dielectric layer is formed on the periphery of the recess, and a gate is formed on the dielectric layer. After that, source and drain regions are respectively formed in the active area adjacent to the recess.

According to an embodiment of the present invention, the method also includes forming a liner on the surface of the recess after the step of forming the recess in the substrate and before the step of forming the filling layer to fill the recess.

According to an embodiment of the present invention, the material of the liner may include silicon nitride or silicon oxynitride (SiON).

According to an embodiment of the present invention, the method of forming the active area includes removing a portion of the substrate.

According to an embodiment of the present invention, after the step of removing the filling layer and before the step of forming the dielectric layer, the method also includes forming divots around the recess by removing a portion of the insulation layer adjacent to sidewalls of the substrate so that the sidewalls of the substrate are exposed, and then removing the liner.

According to an embodiment of the present invention, the material of the filling layer may include polysilicon, amorphous silicon or single crystal silicon.

According to an embodiment of the present invention, before the step of forming the dielectric layer, the method also includes implanting nitrogen ions into the surface of the channel region so as to form the dielectric layer with a thinner thickness on the channel region than on other regions.

The method of fabricating a semiconductor device having a recess channel structure according to an embodiment of the present invention can prevent the formed recess from being excessively extended.

Moreover, according to the method of an embodiment of the present invention, the divots formed adjacent to the recess channel region have similar sizes and depths.

Furthermore, the method in accordance with the present invention does not require a sandwich structure including a liner.

In order to make the aforementioned and other objects, features and advantages of the present invention comprehensible, a preferred embodiment accompanied with figures is described in detail below.

DESCRIPTION OF EMBODIMENTS

FIGS. 2A to 2G are schematic top views illustrating a process flow of fabricating a MOS device having a recess channel structure according to an embodiment of the present invention. FIGS. 3A to 3G are schematic cross-sectional views taken along line III-III of FIGS. 2A to 2G. FIGS. 4A to 4G are schematic cross-sectional views taken along line IV-IV of FIGS. 2A to 2G.

Figure 1A:
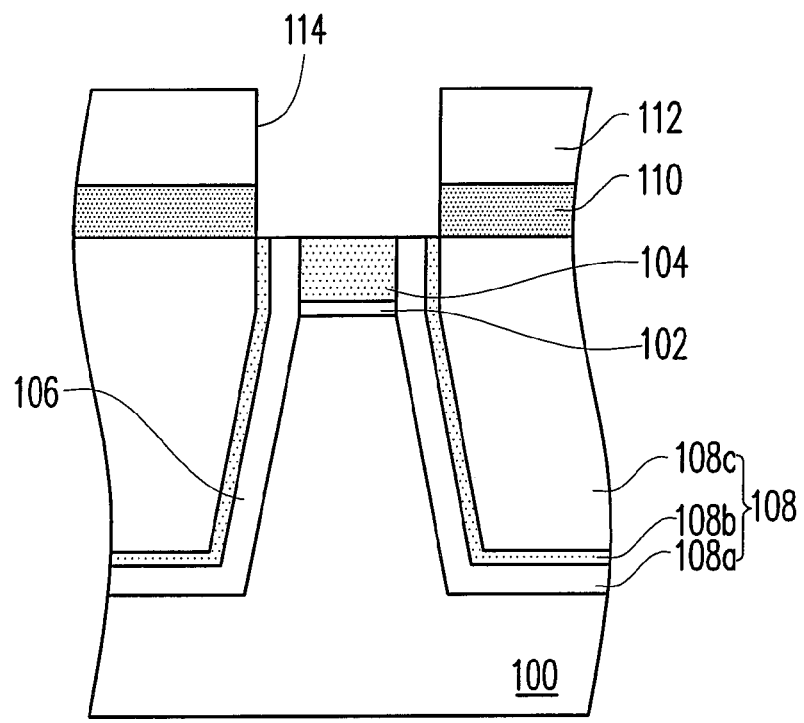
FIGS. 1A to 1E are schematic cross-sectional views illustrating a process flow of fabricating a conventional MOS device having a recess channel structure.
Figure 1B:
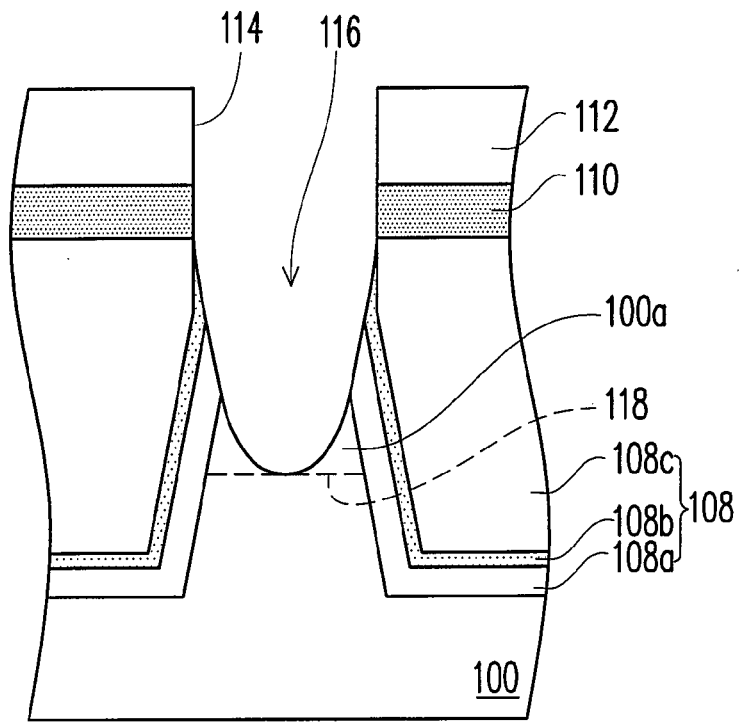
Figure 1C:
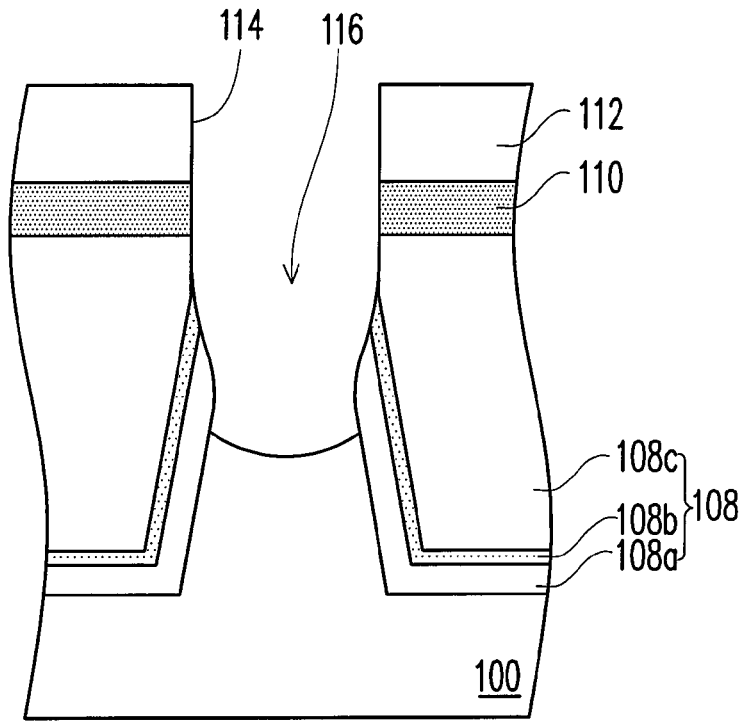
Figure 1D:
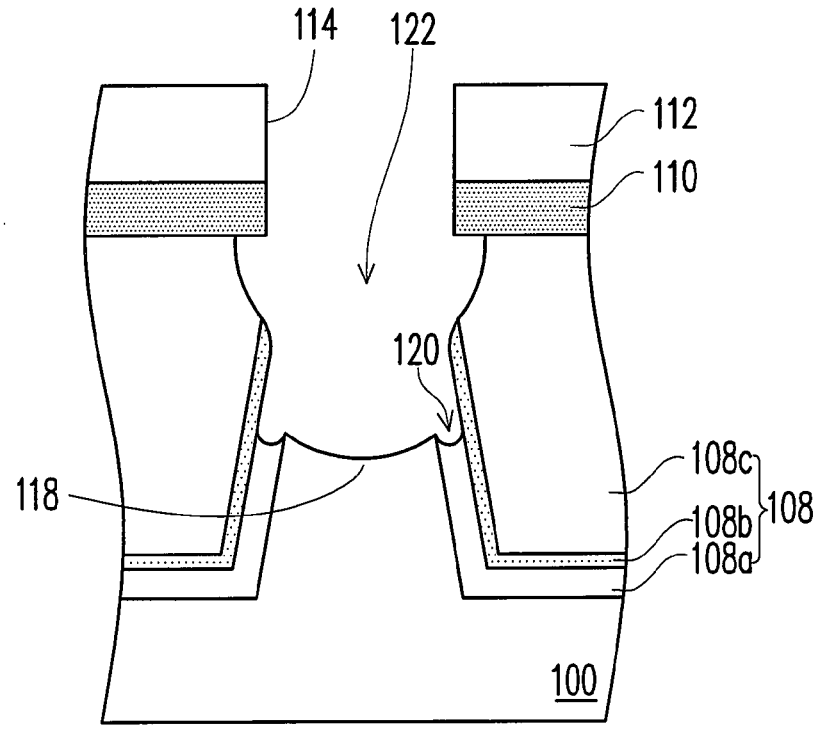
Figure 1E:
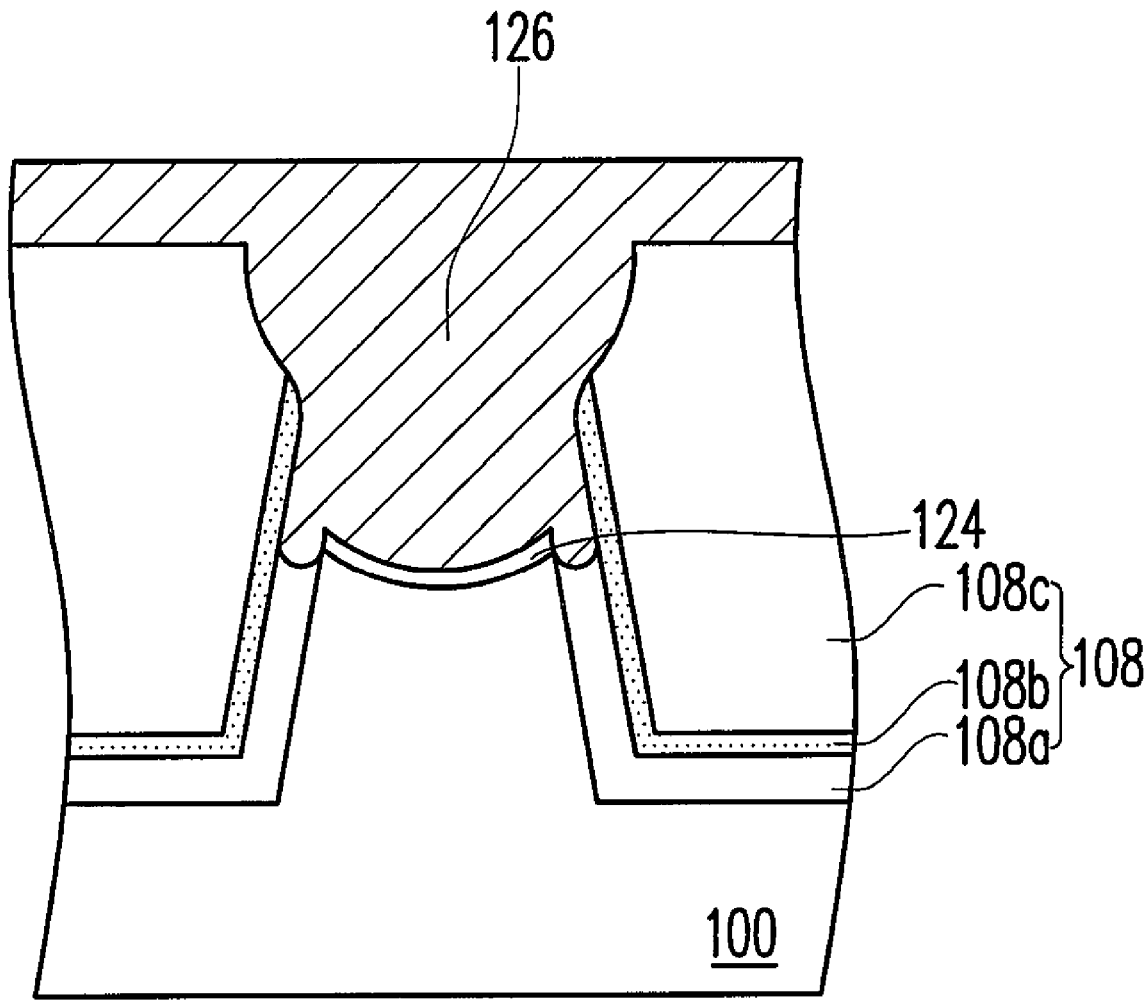
Figure 2A:
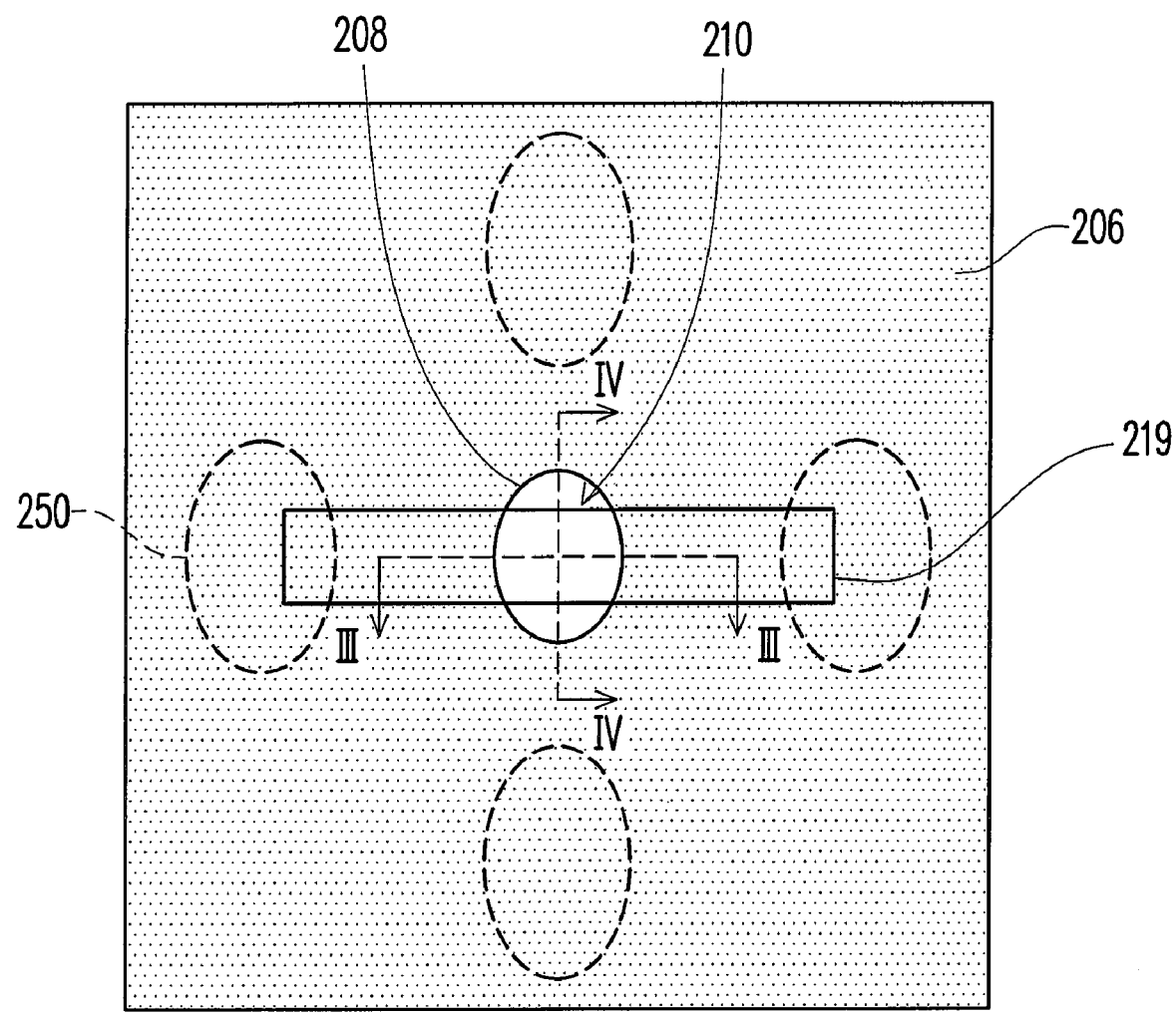
FIGS. 2A to 2G are schematic top views illustrating a process flow of fabricating a MOS device having a recess channel structure according to an embodiment of the present invention.
Figure 3A:
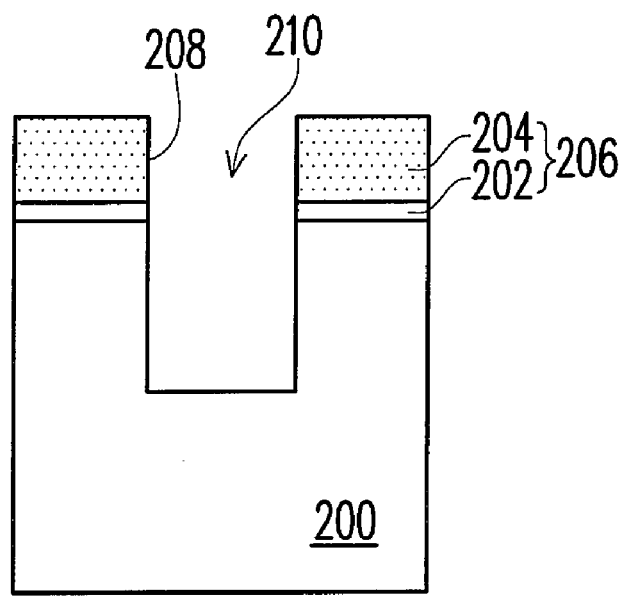
FIGS. 3A to 3G are schematic cross-sectional views taken along line III-III of FIGS. 2A to 2G.
Figure 4A:
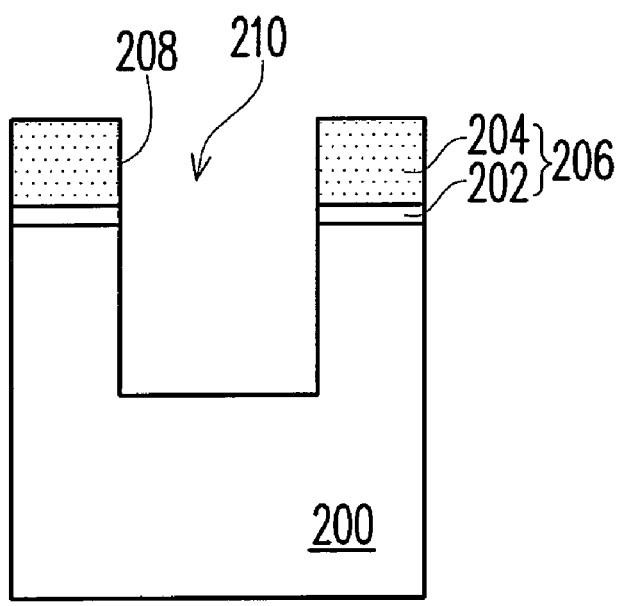
FIGS. 4A to 4G are schematic cross-sectional views taken along line IV-IV of FIGS. 2A to 2G.

A process flow of fabricating a vertical transistor according to this invention is provided. Referring to FIGS. 2A, 3A and 4A, a mask layer 206 is formed on a substrate 200. The mask layer 206 has an opening 208 to expose a region which is predetermined to form a recess channel region in the substrate 200. In one embodiment, the mask layer 206 includes a patterned pad oxide layer 202 and a patterned pad nitride layer 204. The material of the patterned pad oxide layer 202 is silicon oxide, for example. The material of the patterned nitride layer 204 is silicon nitride, for example. The method of forming the patterned pad oxide layer 202 and the patterned pad nitride layer 204 includes forming a silicon oxide layer by a thermal oxidation process or a CVD (chemical vapor deposition) process, and then forming a silicon nitride layer by a CVD process, for example. Thereafter, a photolithography-and-etching process is performed to form the patterned pad oxide layer 202 and the patterned pad nitride layer 204 having the opening 208. Then, an etching process is performed, using the mask layer 206 as an etching mask, to form a recess 210 in the substrate 200. The etching process is a dry etching process, for example. When the present invention is applied to a DRAM (dynamic random access memory) with deep trench capacitors, the deep trench capacitors 250 have been formed in the substrate 200 before the vertical transistor is formed.

Figure 2B:
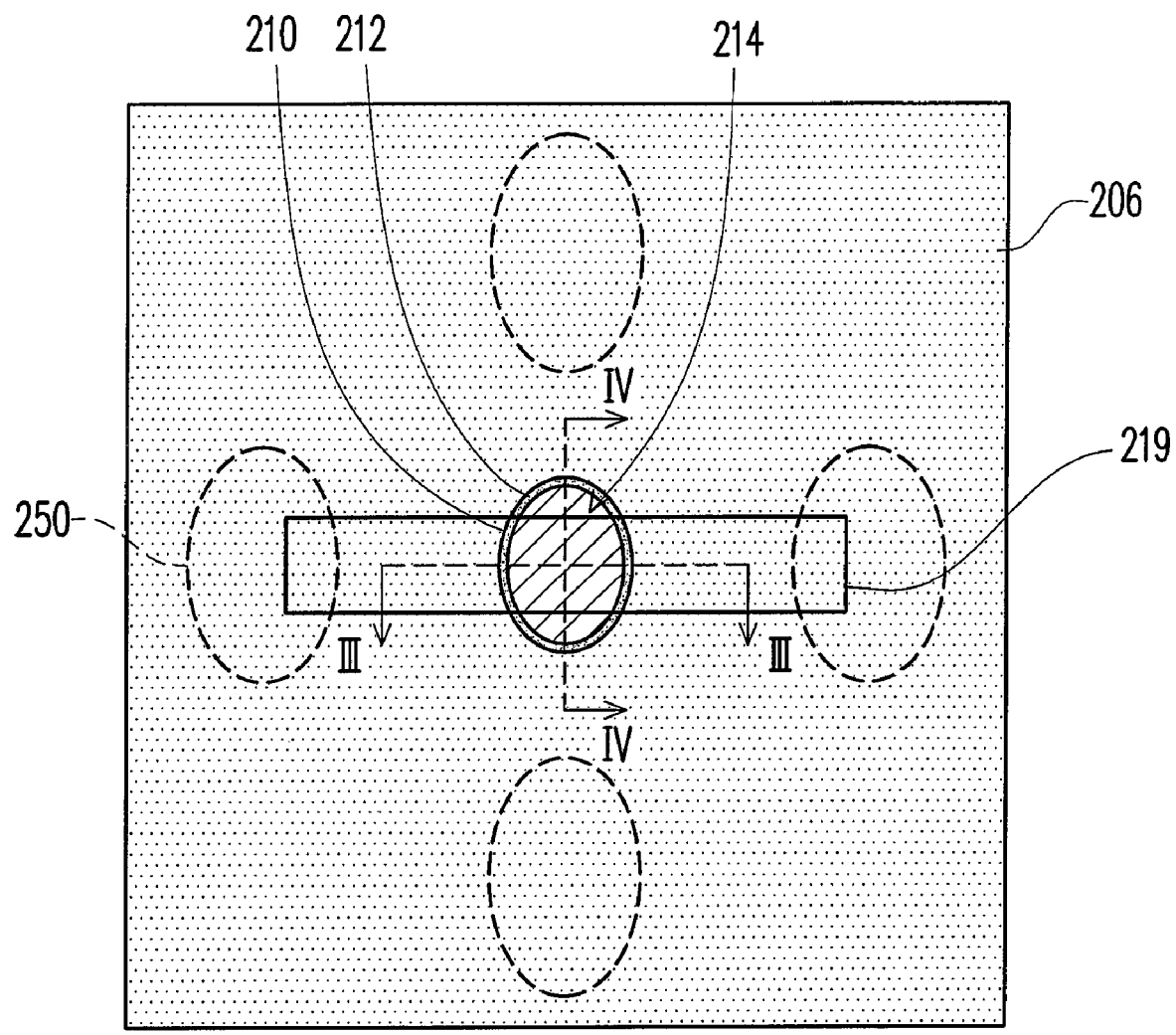
Figure 3B:
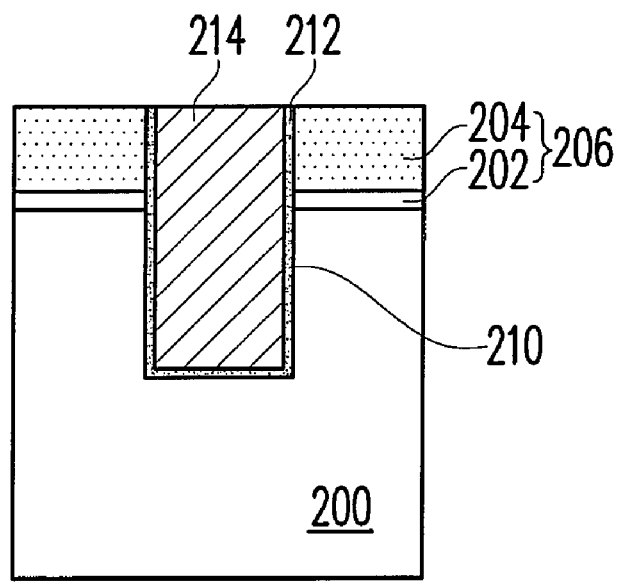
Figure 4B:
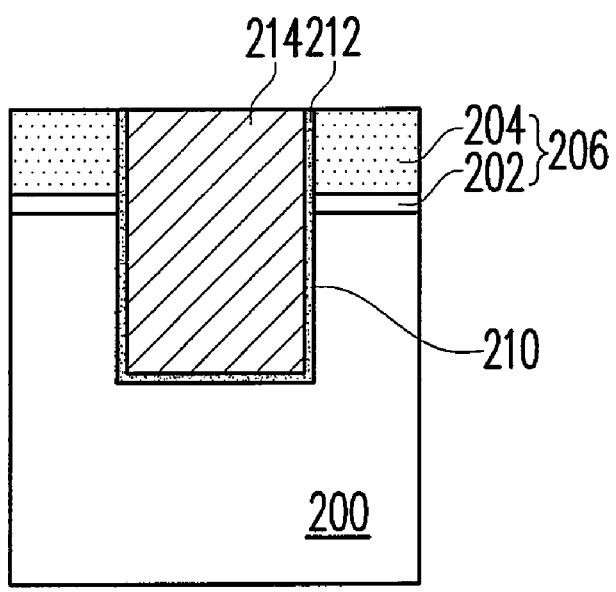

Referring to FIGS. 2B, 3B and 4B, a liner 212 is formed on the surface of the recess 210, and a filling layer 214 is formed in the recess 210. The method of forming the liner 212 and the filling layer 214 includes forming a liner material layer and a filling material layer sequentially over the substrate 200 to cover the surface of the recess 210 by a CVD process, for example. Thereafter, a CMP (chemical mechanical polishing) process or an etching back process is performed to remove the part of the liner material layer and the filling material layer, which are outside the recess 210. The liner material layer may include nitride, such as silicon nitride, silicon oxynitride (SiON) or the material having an etching selectivity relative to the filling layer 214. The liner 212 serves as an etching stop layer to prevent the substrate 200 from being etched when the filling layer 214 is subsequently removed. The filling material layer may include the material having a different etching rate relative to the insulation layer of the isolation structures which will be subsequently formed, such as doped or undoped polysilicon, amorphous silicon or single crystal silicon.

Figure 2C:
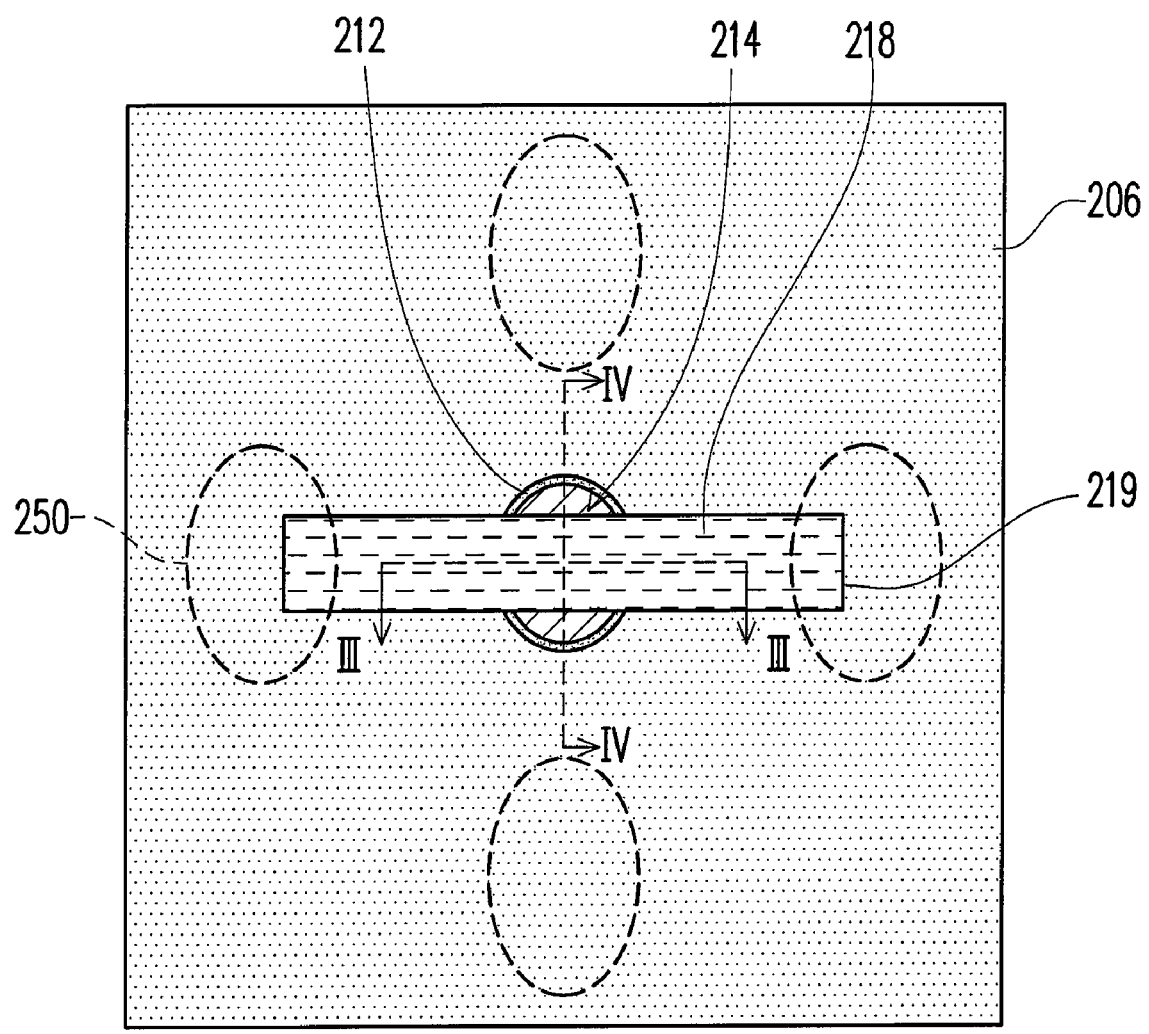
Figure 3C:
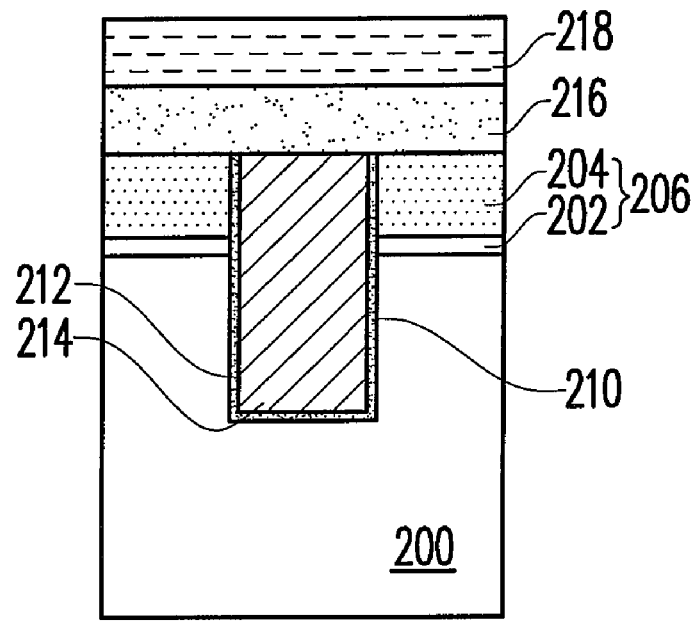
Figure 4C:
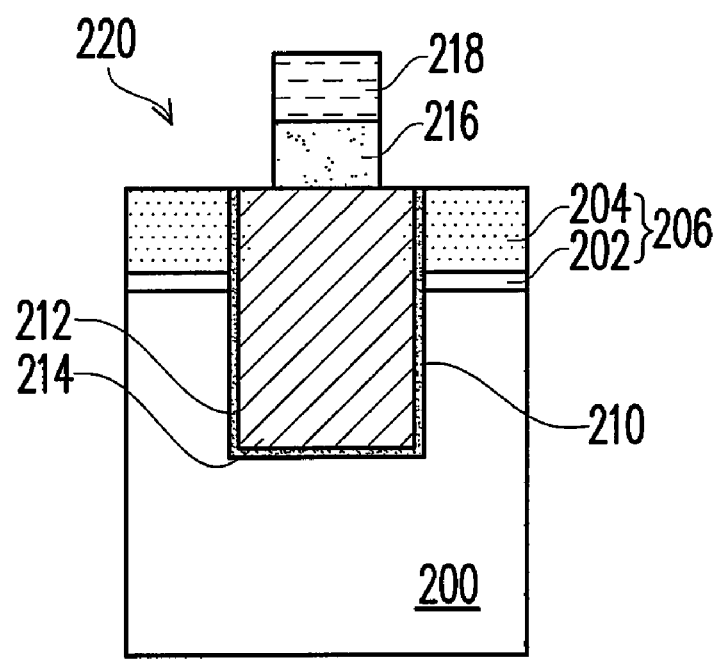

Referring to FIGS. 2C, 3C and 4C, a patterned hard mask layer 216 and a patterned photoresist layer 218 having an opening 220 are formed on the mask layer 206. The patterned hard mask layer 216 and the patterned photoresist layer 218 cover a predetermined active area 219. The opening 220 exposes a portion of the liner 212 on the sidewall of the recess 210, a portion of the filling layer 214 in the recess 210, and the mask layer 206 outside the recess 210. The method of forming the patterned hard mask layer 216 and the patterned photoresist layer 218 includes forming a hard mask material layer on the substrate 200 by a CVD process, and then forming a photoresist material layer by a spin coating process on the hard mask material layer. Thereafter, an exposure-and-development process is performed on the photoresist material layer to form the patterned photoresist layer 218. Then, an etching process is performed, using the patterned photoresist layer 218 as an etching mask, on the hard mask material layer to form the patterned hard mask layer 216. The hard mask material layer may include silicon oxide or phosphosilicate glass (PSG) formed from the reactive gas of silicon carbon (SiC) or tetraethyl orthosilicate (TEOS).

Figure 2D:
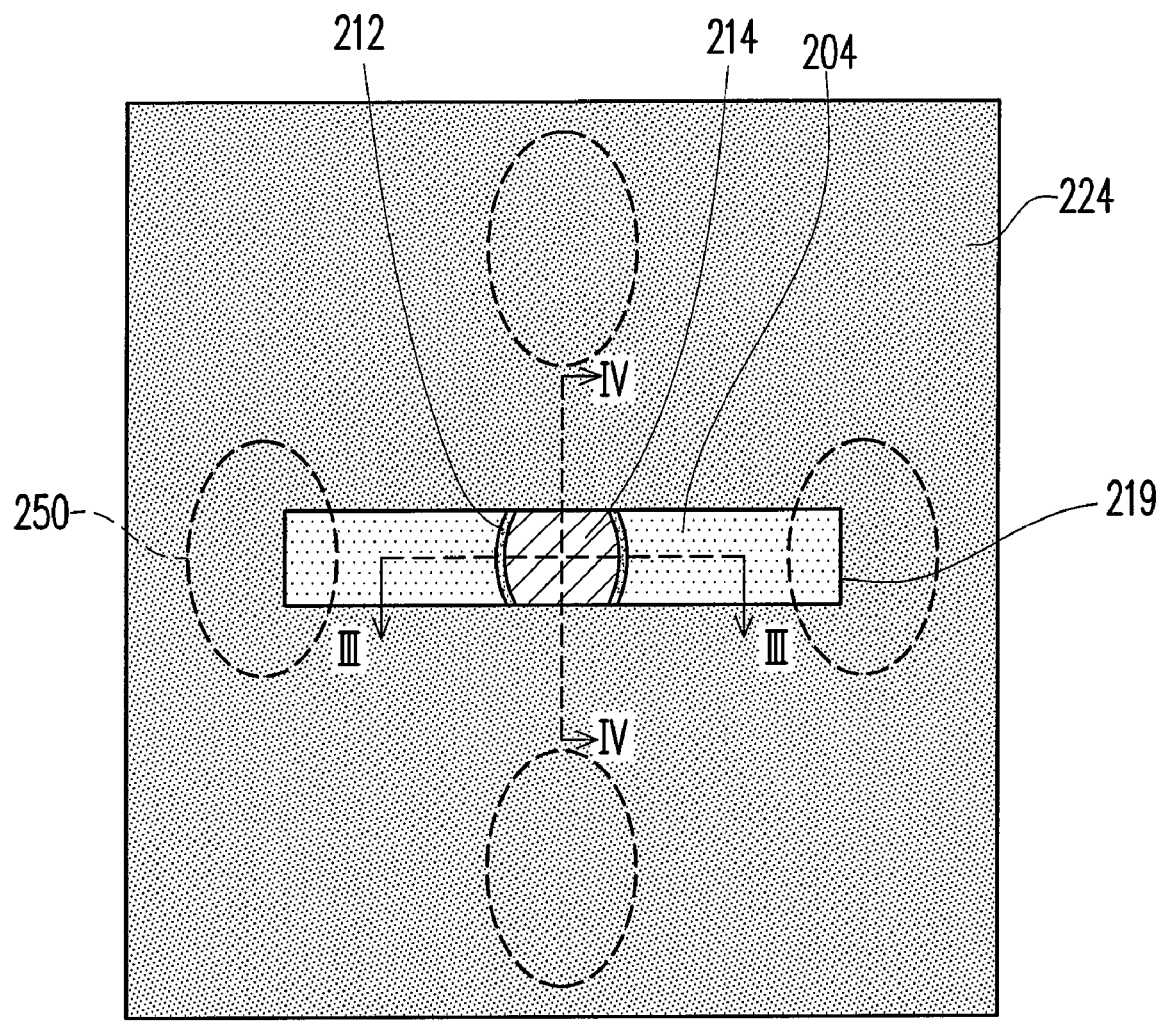
Figure 3D:
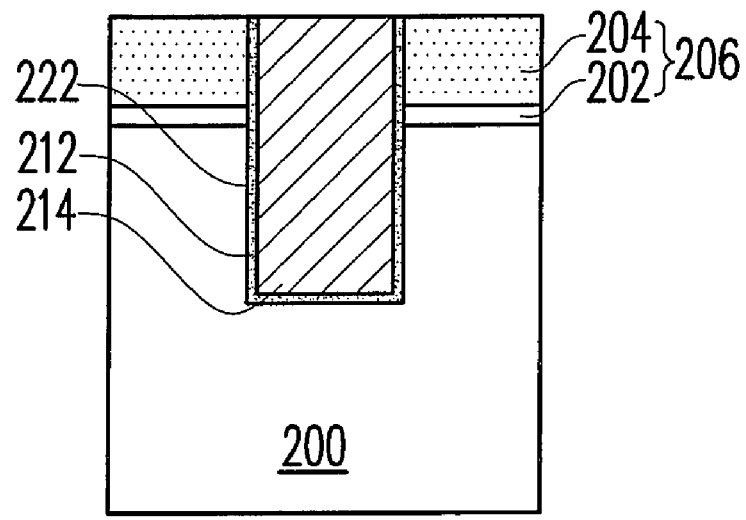
Figure 4D:
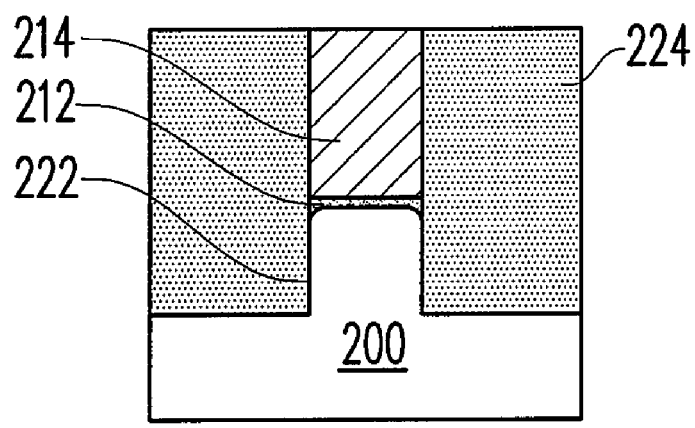

Referring to FIGS. 2D, 3D and 4D, an etching process is performed, using the patterned photoresist layer 218 as an etching mask, to partially remove the filling layer 214, the liner 212, the mask layer 206 and the substrate 200 which are exposed by the opening 220, and thus trenches 222 are formed in the substrate 200. The etching process may include anisotropic etching, such as a dry etching process. When the present invention is applied to a DRAM (dynamic random access memory) with deep trench capacitors, the deep trench capacitors 250 have been formed in the substrate 200 before the vertical transistor is formed. Therefore, a portion of the deep trench capacitors 250 is exposed as the trenches 222 are formed.

Thereafter, the patterned photoresist layer 218 and the patterned hard mask layer 216 are removed to expose the patterned mask layer 206. A thermal oxidation process is then performed to repair the damaged crystal lattice and round the bottom corners of the trenches 222 as well. Then, an insulation layer 224 fills into the trenches 222 so as to form isolation structures in the substrate 200. The method of forming the insulation layer 224 includes forming an insulation material layer cover the trenches 222 and the patterned mask layer 206, and then performing a CMP process or an etching back process to partially remove the insulation material layer which is outside the trenches 222. It is noted that the predetermined recess channel region is already defined in the substrate 200, so the insulation material layer can be a single layer such as a silicon oxide layer. In accordance with the present invention, the conventional sandwich structure including a liner is not necessary.

Figure 2E:
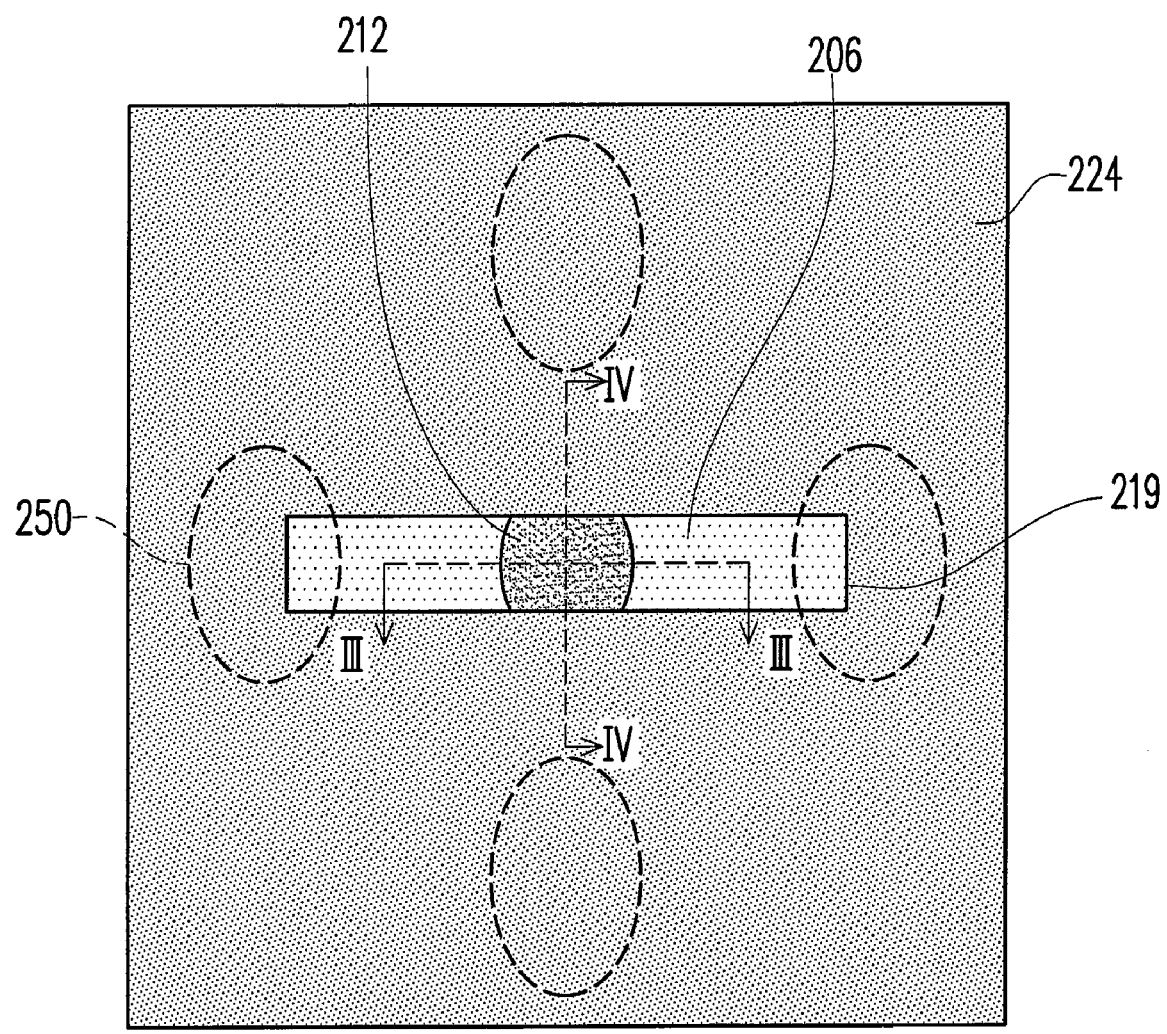
Figure 3E:
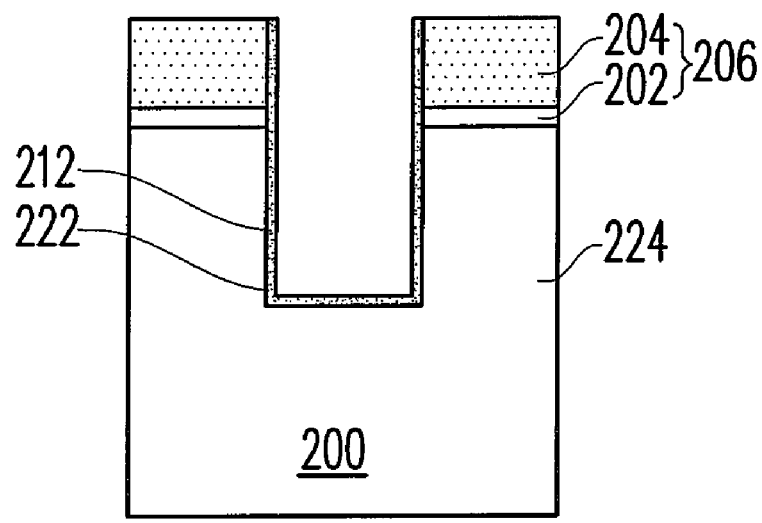
Figure 4E:
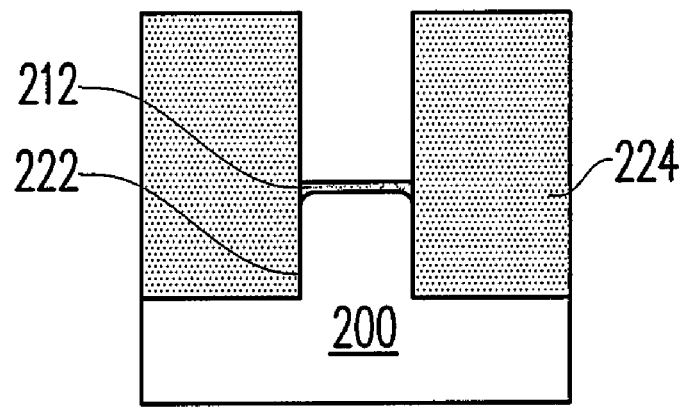

Referring to FIGS. 2E, 3E and 4E, the filling layer 214 is removed, using the mask layer 206 and the insulation layer 224 as an etching mask and the liner 212 as an etching stop layer. The removing process of the filling layer 214 may include isotropic etching, such as a wet etching process.

Figure 2F:
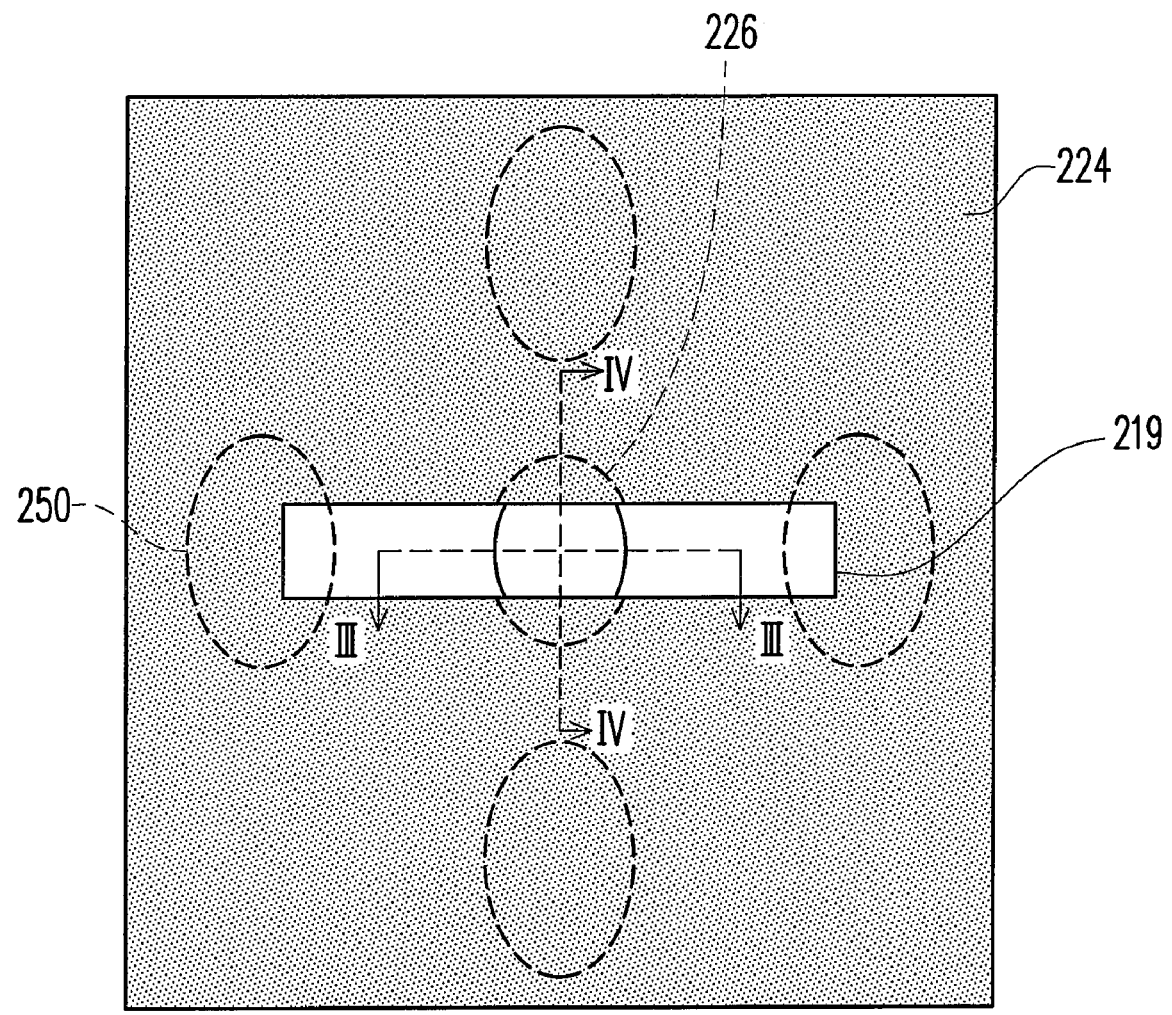
Figure 3F:
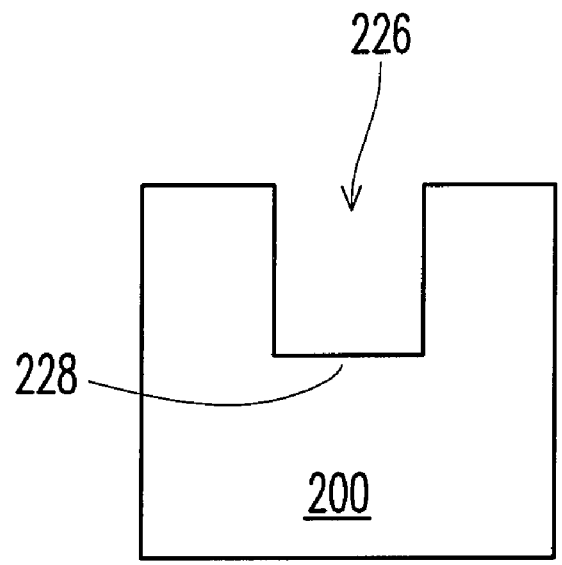
Figure 4F:
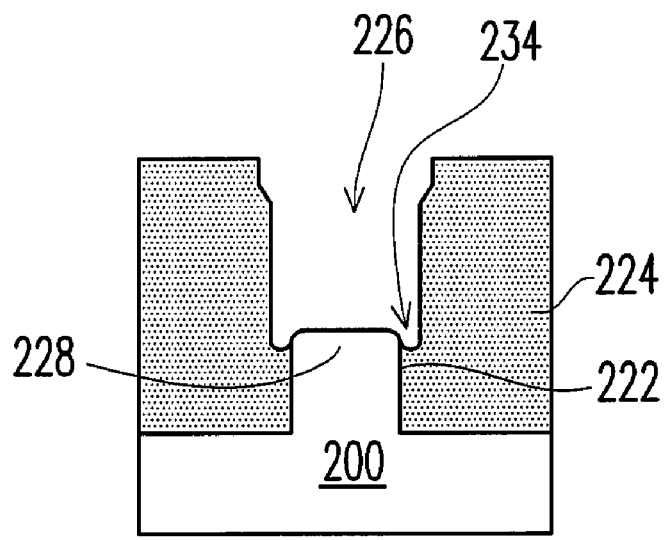

Referring to FIGS. 2F, 3F and 4F, a portion of the insulation layer 224 is removed using the liner 212 as an etching stop layer. The removing process is to remove a peripheral portion of the insulation layer 224 adjacent to the sidewalls of the recess 210 and then extends downwardly to remove another portion of the insulation layer 224 adjacent to the sidewalls of the substrate 200 which is between the trench 222 and the substrate 200. That is, the substrate 200 has a protrusion (not numbered) formed on a bottom of the recess 226 when the insulation layer 224 is partially removed for the second time. Hence, a recess 226 with divots 234 is formed, and the surface of the divots 234 is below the surface of the recess channel region 228. The removing process, i.e. CDF (corner device formation) process, may include isotropic etching, such as a wet etching process. Thereafter, the liner 212 and the mask layer 206 are removed to expose the active area 219, and the removing method may include isotropic etching, such as a wet etching process. When the mask layer 206 are formed with pad oxide layer 202 and the pad nitride layer 204, and the liner 212 is a nitride layer, a hot phosphorous acid is used to remove the pad nitride layer 204 and the liner 212, and a fluoric acid is used to remove the pad oxide layer 202. After the liner 212 is removed, the surface of the substrate 200 exposed on the bottom of the recess 226 serves as the recess channel region 228 of the transistor.

Figure 2G:
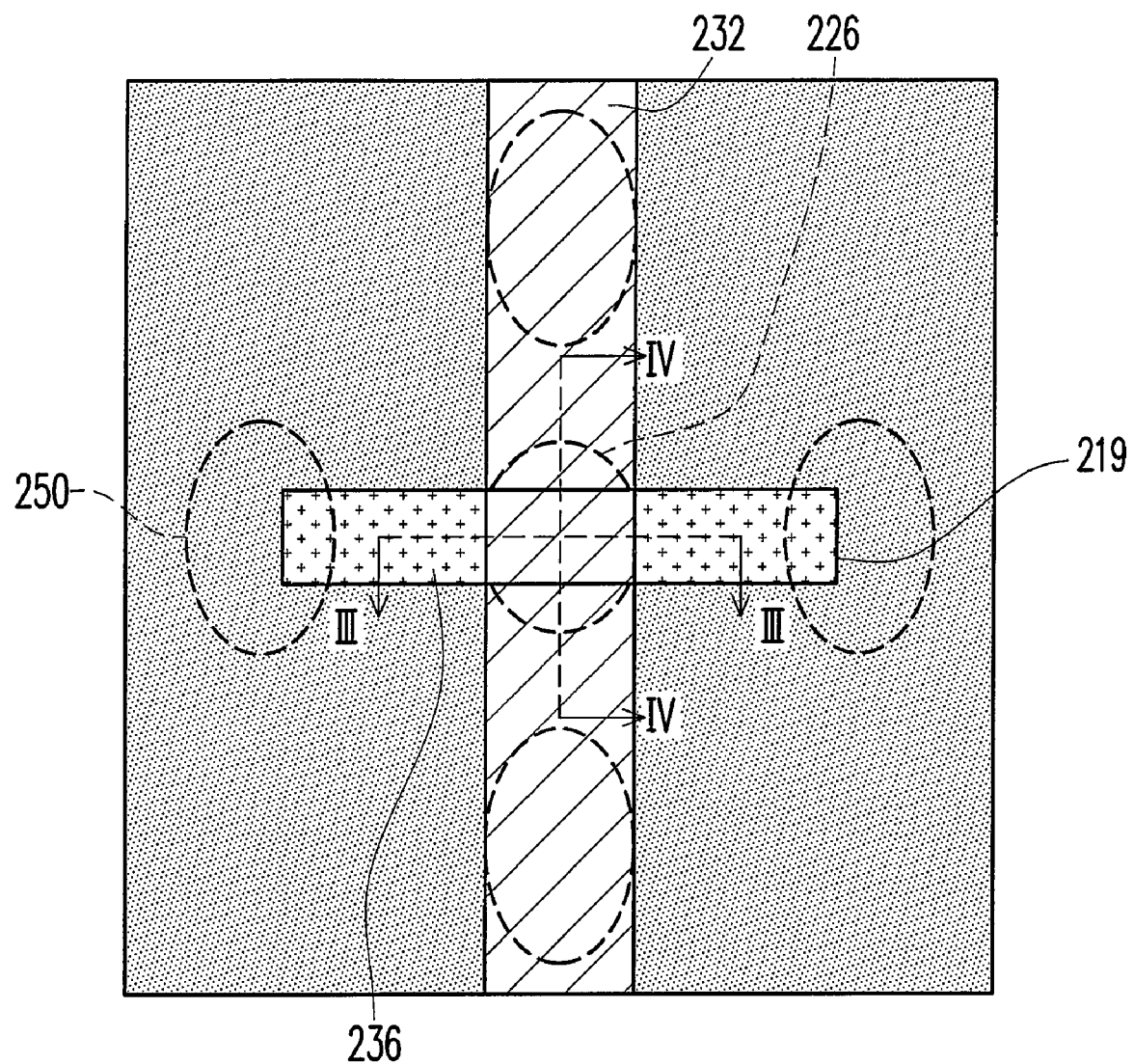
Figure 3G:
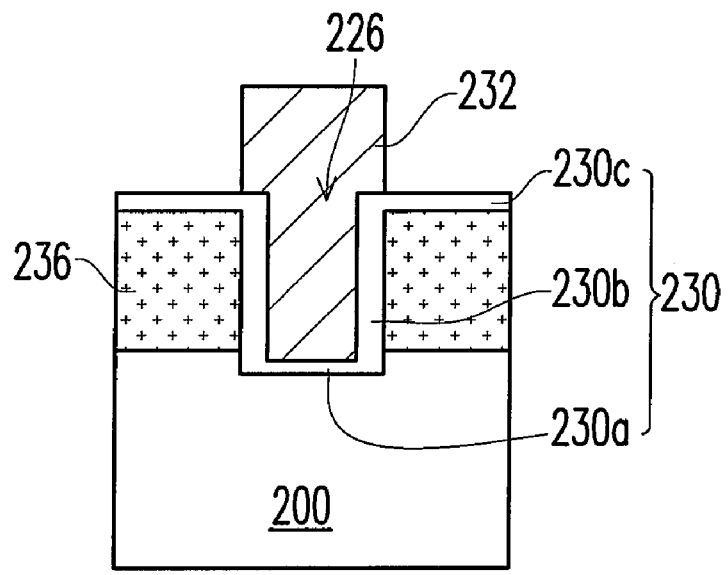
Figure 4G:
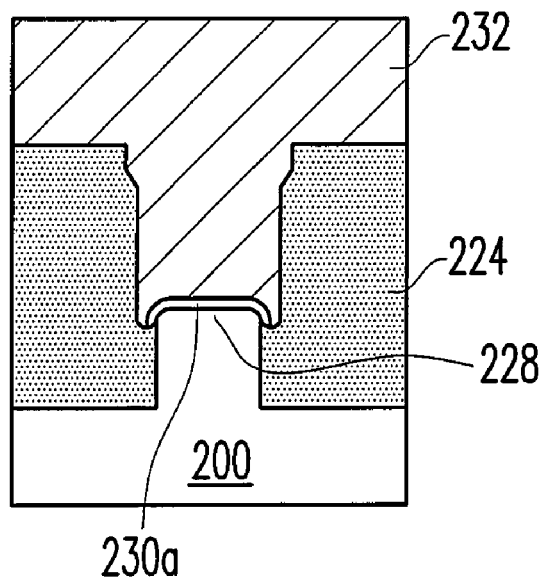

Referring to FIGS. 2G, 3G and 4G, a dielectric layer 230 is formed on the exposed surface of the substrate 200. A gate 232 is then formed in the recess 226. The dielectric layer 230 includes three portions 230a, 230b and 230c. The portion 230a serves as a gate dielectric layer covering the recess channel region 228. The portion 230b on the sidewalls of the recess 226 serves as spacers. The portion 230c serves as an insulation layer over the substrate 200 covering the outside of the recess 226. The method of forming the dielectric layer 230 and the gate 232 includes forming a dielectric material layer by a thermal oxidation process or a CVD process, and then forming a gate conductive layer by a CVD process, for example. Afterwards, a photolithography-and-etching process is performed to pattern the gate conductive layer. The dielectric material layer may include silicon oxide or a high dielectric constant material. In one embodiment, the method of forming the dielectric material layer includes implanting nitrogen ions into the recess channel region 228 by an ion implant process, and then performing a thermal oxidation process to form the silicon oxide layer. The oxidation rate of the recess channel region 228, due to the nitrogen ion implanted therein, is slower than that of other regions without the nitrogen ion implantation, so the silicon oxide layer 230a has a thickness thinner than that of the silicon oxide layers 203b and 230c. The gate conductive layer may be a polycide layer formed with a doped polysilicon layer and a metal silicide layer. The method of forming the polycide layer includes forming the doped polysilicon layer, and then depositing the metal silicide layer directly on the doped polysilicon layer, for example. The material of the metal silicide layer may include silicon tungsten or silicon titanium. It is for sure that the gate 232 can be a single-layer structure or a multiple-layer structure formed from more than two conductive materials.

After the gate 232 is formed, an ion implant process is performed to form source and drain regions 236 in the substrate adjacent the recess 226. When manufacturing an N-channel MOS device, the implant ion is an N-type dopant, such as phosphorous or arsenic. When manufacturing a P-channel MOS device, the implant ion is a P-type dopant, such as boron.

In accordance with the method of the present invention, a region of the substrate where the recess channel region is predetermined to be formed is removed to form a recess, and then the filling layer fills the recess before the isolation structures are formed. After the isolation structures are formed, the recess having the recess channel region is formed simply by removing the filling material from the predetermined region, followed by forming the divots. Therefore, no short current caused by the lateral overetching is observed when the divots are formed. Moreover, the formed divots of the corner device is symmetric so that problems such as uneven depths or different sizes can be obviated. In addition, the manufacturing process is very simple. The sandwich structure of the conventional isolation structure including a liner is not necessary; thus, when forming the divots of the corner device, the process would not be stopped by the liner of the conventional isolation structure. Therefore, the depth of the divots is deep enough, and the reliability of the device is enhanced. Furthermore, the spacers between the gate and the substrate are formed simultaneously when the gate dielectric layer is formed. In other words, unlike the conventional method, the method in accordance with the present invention does not require an etching process for forming the spacers; thus, the gate dielectric layer would not be damaged by the etching process.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of fabricating a semiconductor device having a recess channel structure therein, comprising:

forming a recess in a substrate;
forming a filling layer in the recess;
forming an active area on the substrate;
removing the filling layer to define a recess channel region;
implanting nitrogen ions into a bottom surface of the recess;
forming a dielectric layer on a periphery of the recess after implanting the nitrogen ions into the bottom surface of the recess, wherein the dielectric layer formed on the bottom surface of the recess has a thickness thinner than that of the dielectric layer formed on two opposed sides of the recess;
forming a gate on the dielectric layer; and
forming source and drain regions in two opposed sides of the recess in the active area.

2. The method of fabricating a semiconductor device having a recess channel structure therein according to claim 1, wherein the filling layer is formed of a material selected from the group consisting of polysilicon, amorphous silicon and single crystal silicon.

3. The method of fabricating a semiconductor device having a recess channel structure therein according to claim 1, further comprising forming a liner on the surface of the recess after the step of forming the recess in the substrate and before the step of forming the filling layer in the recess.

4. The method of fabricating a semiconductor device having a recess channel structure therein according to claim 3, wherein the liner is formed of a material selected from the group consisting of silicon nitride and silicon oxynitride (SiON).

5. The method of fabricating a semiconductor device having a recess channel structure therein according to claim 3, after the step of removing the filling layer and before the step of forming the dielectric layer, further comprising:

forming divots around the recess by removing a portion of the insulation layer adjacent to sidewalls of the substrate such that sidewalls of the substrate are exposed; and
removing the liner.

* * * * *